United States Patent
Togo

[19]

[11] Patent Number: 6,051,861

[45] Date of Patent: Apr. 18, 2000

[54] SEMICONDUCTOR DEVICE WITH REDUCED FRINGE CAPACITANCE AND SHORT CHANNEL EFFECT

[75] Inventor: Mitsuhiro Togo, Tokyo, Japan

[73] Assignee: NEC Corporation, Tokyo, Japan

[21] Appl. No.: 08/813,361

[22] Filed: Mar. 7, 1997

[30] Foreign Application Priority Data

Mar. 7, 1996 [JP] Japan ..................................... 8-050525

[51] Int. Cl.[7] .......................... H01L 29/76; H01L 31/062
[52] U.S. Cl. .......................... 257/340; 257/276; 257/386; 257/410; 438/216
[58] Field of Search ................................... 257/276, 340, 257/386, 410; 438/216, 264

[56] References Cited

U.S. PATENT DOCUMENTS

| | | | |
|---|---|---|---|
| 3,886,584 | 5/1975 | Cook, Jr. et al. ........................ | 257/410 |
| 4,638,347 | 1/1987 | Iyer ......................................... | 257/386 |
| 4,697,333 | 10/1987 | Nakahara ................................ | 438/301 |
| 5,389,557 | 2/1995 | Jung-Suk ................................ | 438/305 |
| 5,587,343 | 12/1996 | Kano et al. .............................. | 438/52 |

FOREIGN PATENT DOCUMENTS

| | | | |
|---|---|---|---|
| 195 08 485 | 9/1995 | Germany . | |
| 54-143076 | 11/1979 | Japan ..................................... | 257/386 |
| 61-134073 | 8/1986 | Japan . | |
| 61-29176 | 2/1988 | Japan . | |
| 63-177469 | 7/1988 | Japan ..................................... | 257/410 |
| 1-286363 | 11/1989 | Japan . | |
| 7-86589 | 3/1995 | Japan . | |
| 7-193233 | 7/1995 | Japan . | |

OTHER PUBLICATIONS

J. Huang et al., Electronics Letters, "Vacuum–Insulated–Gate Field–Effects Transistor." vol. 25, No. 23 pp. 1571–1573 (1989).

Hori et al., "Quarter–Micrometer SPI (Self–Aligned Pocket Implantation) MOSFET's And Its Application For Low Supply Voltage Operation", *IEEE Transactions ON Electron Devices*, Vol. 42(1):78–85, (1995).

Primary Examiner—Valencia Martin-Wallace
Assistant Examiner—George C. Eckert, II
Attorney, Agent, or Firm—Foley & Lardner

[57] ABSTRACT

A semiconductor device and a method of producing the same are disclosed. Cavities intervene between a gate electrode and a source and a drain region for reducing a capacitance. The cavities successfully reduce a fringe capacitance between the gate electrode and the source and drain regions. The side walls are lower in height than the gate electrode, so that the electrode protrudes upward over the top of the side walls. Insulation films are etched back in order to expose the surfaces of the gate electrode and source and drain electrodes. Thereafter, silicide is formed on the gate electrode and a substrate. This allows the gate electrode and source and drain electrodes to be wired via the silicide and thereby reduces the resistance of the device.

6 Claims, 12 Drawing Sheets

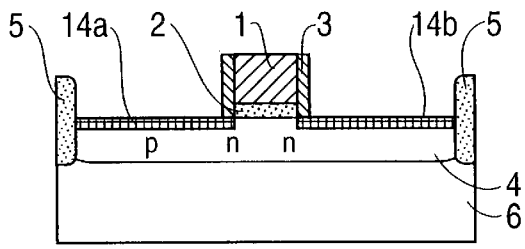
FIG. 2A
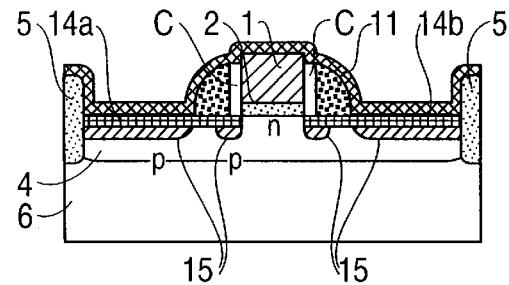
FIG. 2E
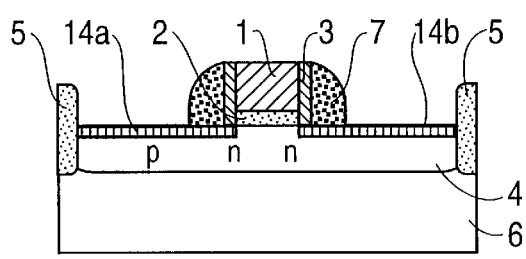
FIG. 2B
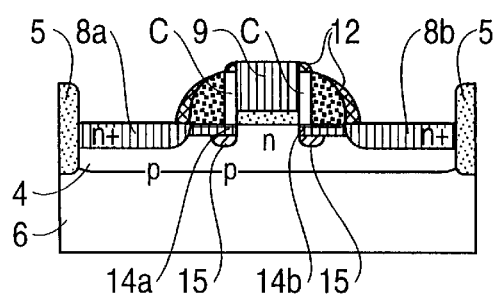
FIG. 2F
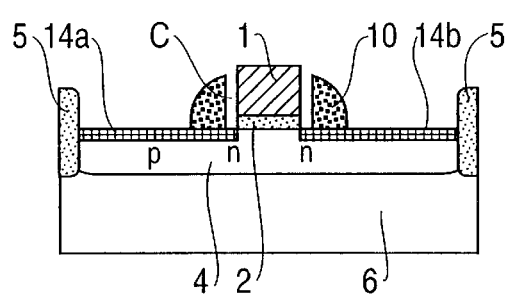
FIG. 2C
FIG. 2G
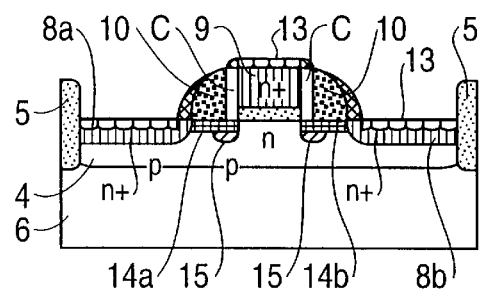
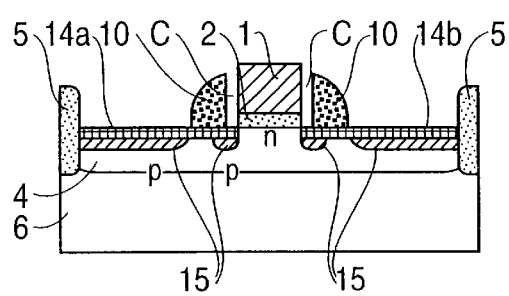
FIG. 2D

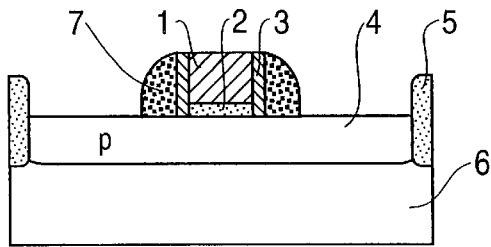
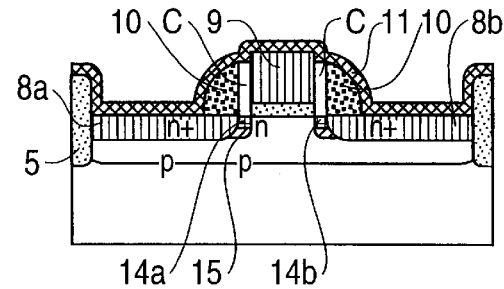
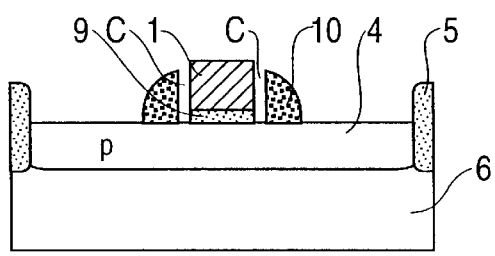
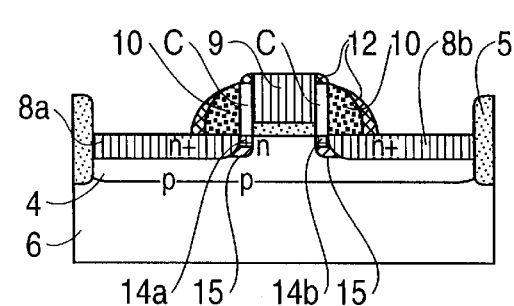
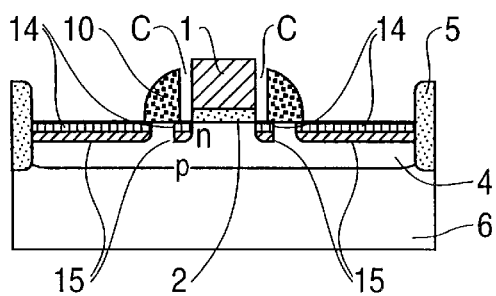
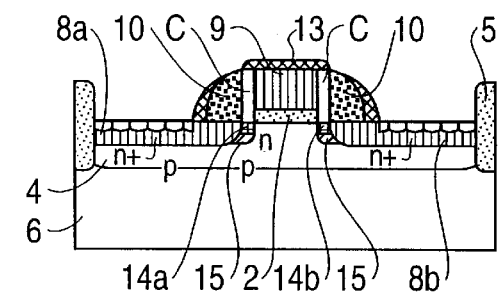
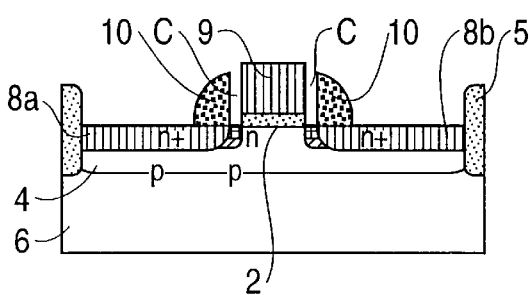

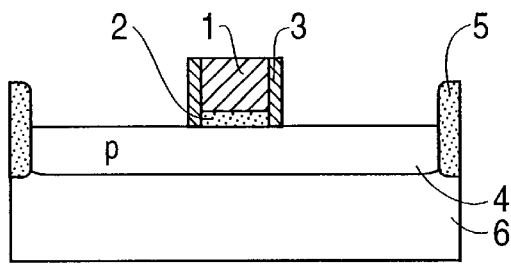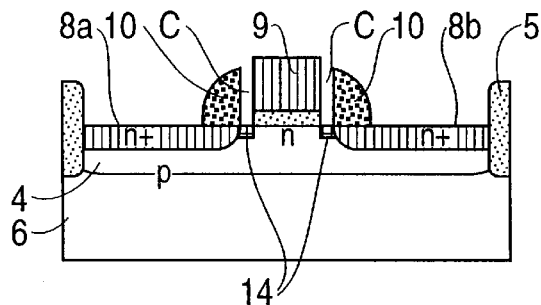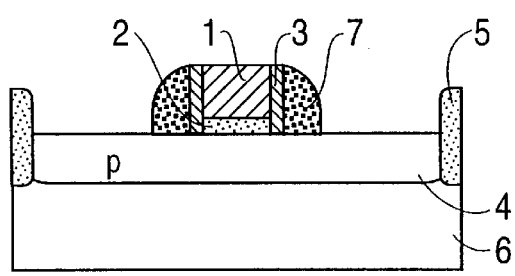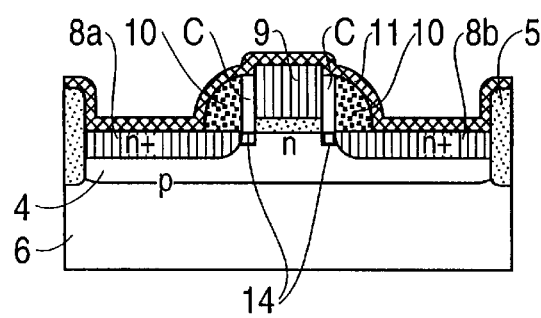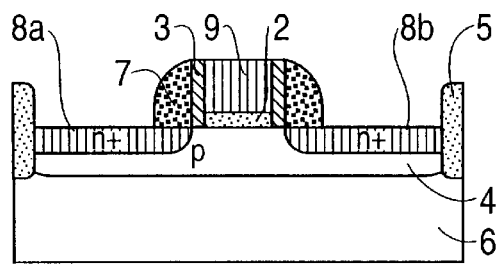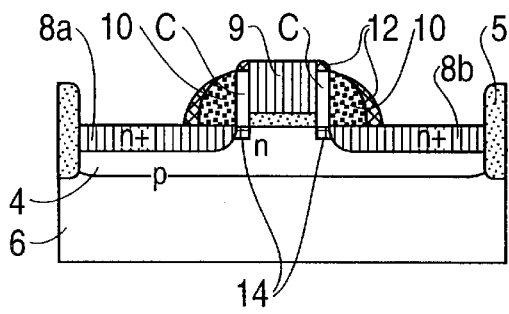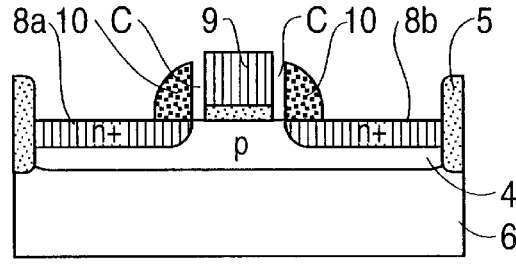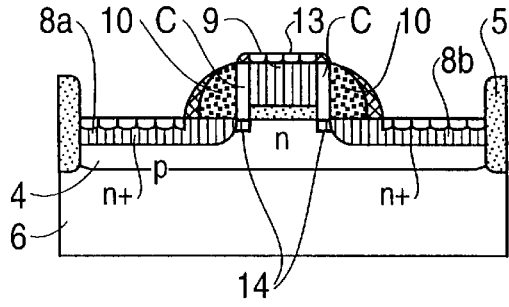

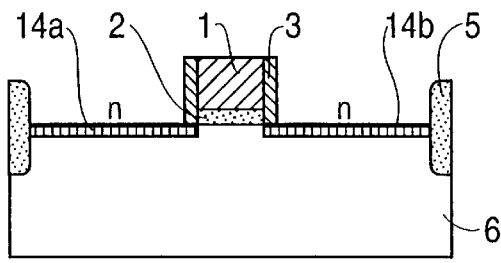
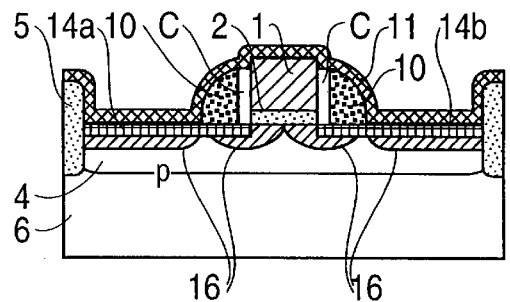
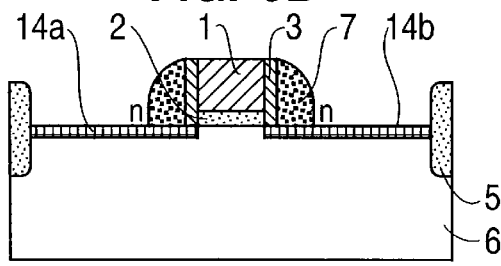
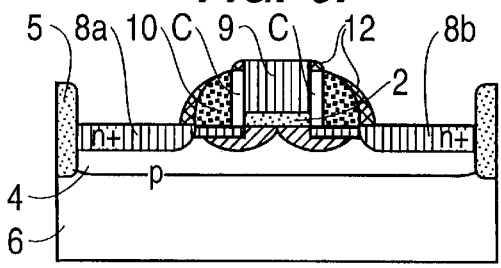
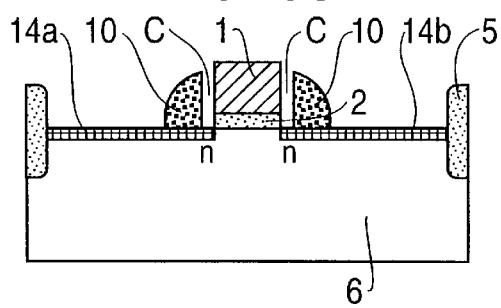
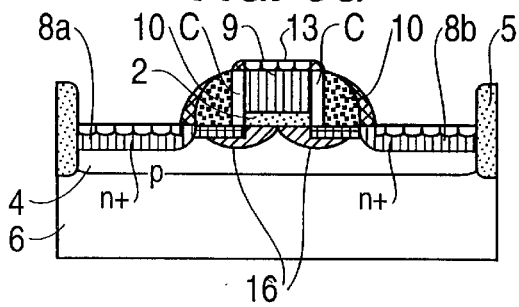
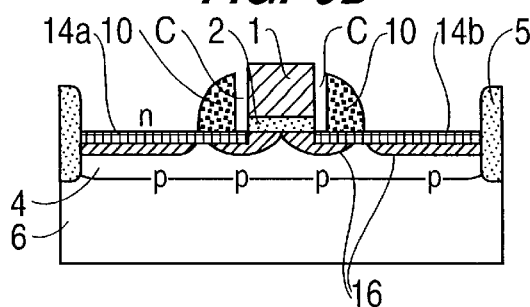

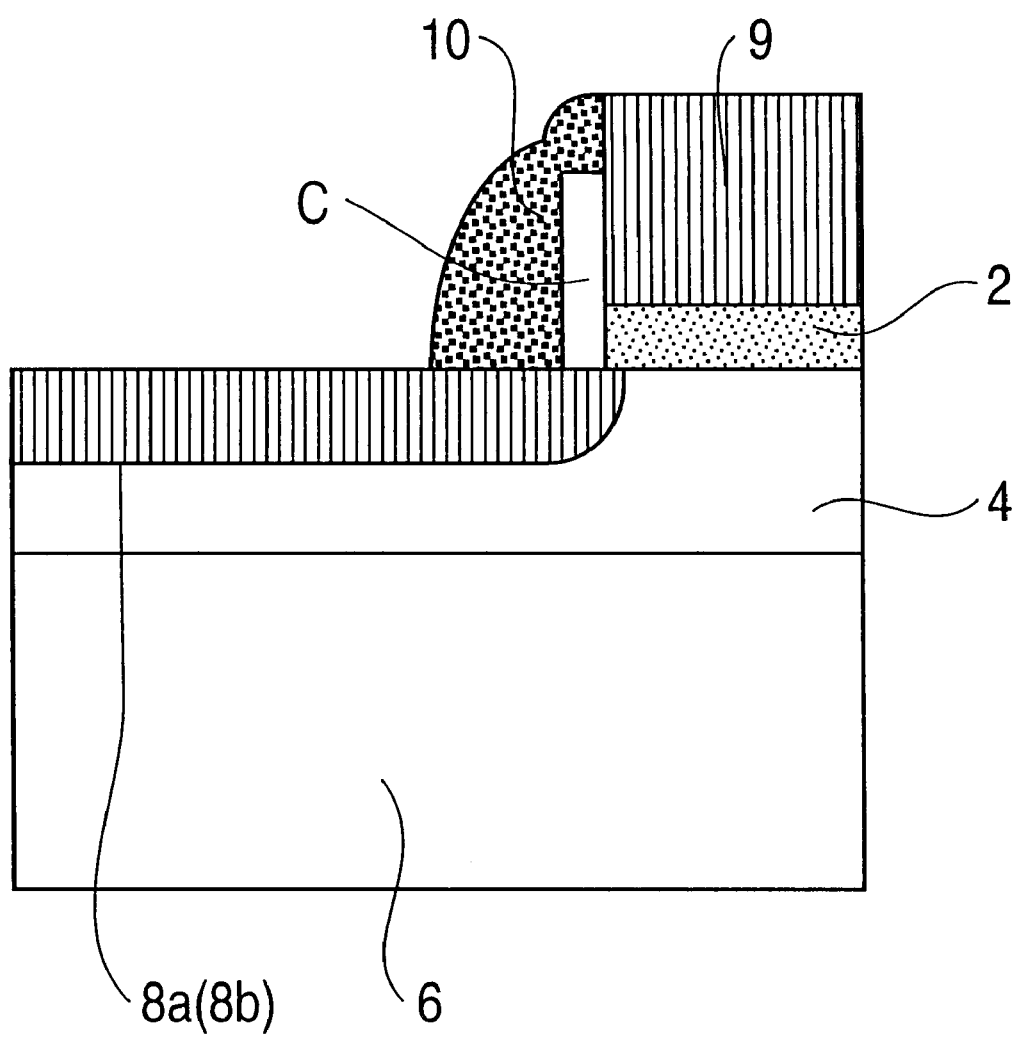

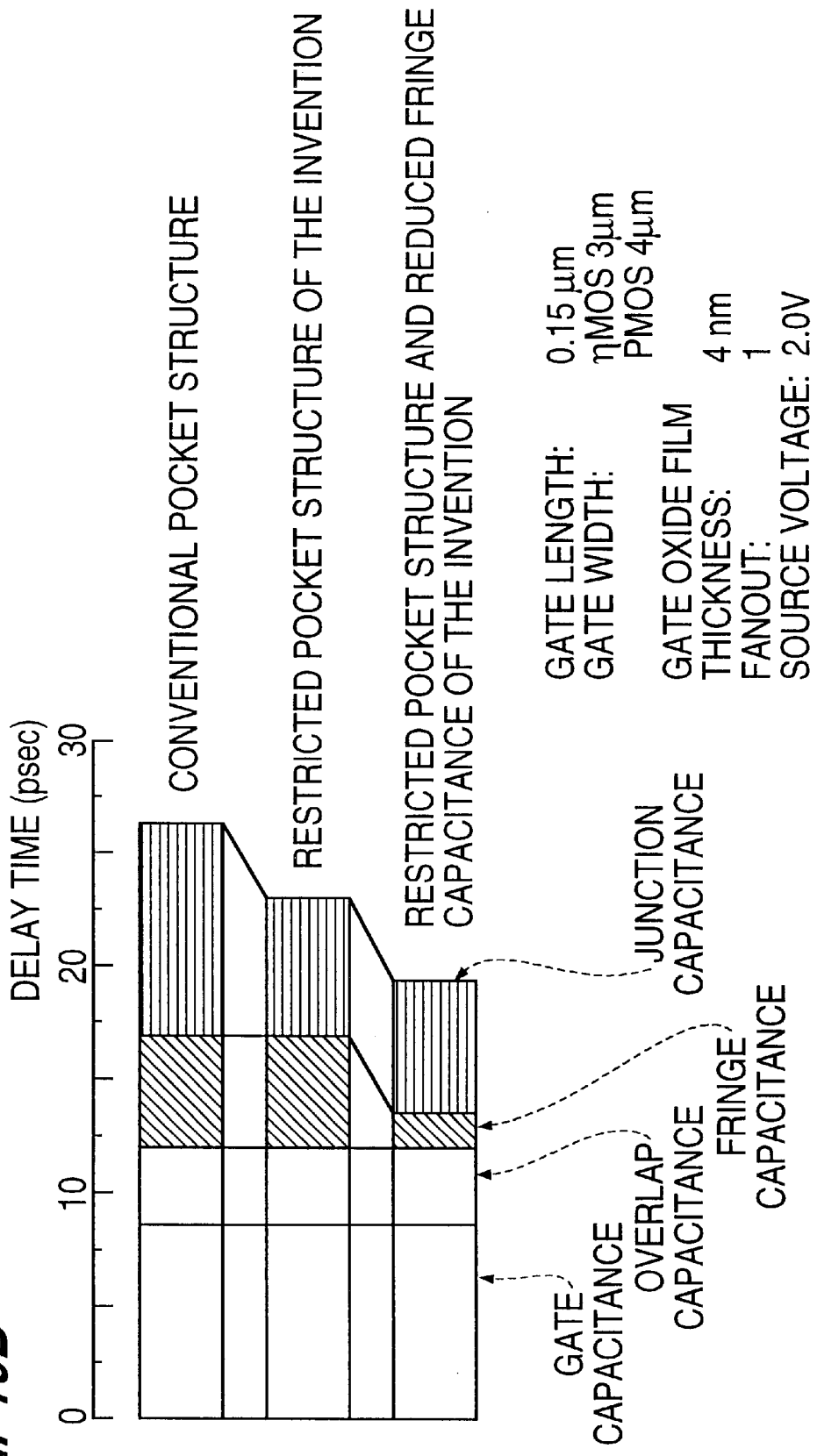

SEMICONDUCTOR DEVICE WITH REDUCED FRINGE CAPACITANCE AND SHORT CHANNEL EFFECT

BACKGROUND OF THE INVENTION

The present invention relates to a semiconductor device and a method of producing the same and, more particularly, to a method of producing an FET (Field Effect Transistor) whose gate electrode has a minimum of fringe capacitance.

To enhance the high-speed operation of a logic LSI or similar semiconductor device, it is necessary to reduce parasitic capacitances which impair the driving ability. However, the problem with a conventional semiconductor device is that a fringe capacitance generated in a gate electrode slows down the circuit operation. The fringe capacitance may be reduced if, use is made of an organic insulation film or similar material having a lower dielectric constant than a silicone oxide film. However, an organic insulation film having low heat resistance and small dielectric constant is not applicable to side walls surrounding the gate, considering heat treatment. Alternatively, cavities may be formed in the side walls, as taught in Japanese Patent Laid-Open Publication No. 1-286363 or No. 7-193233. With the cavity scheme, however, it is impossible to expose the upper portion of the gate electrode or the upper portions of source and drain regions to the outside while keeping the top of the cavities covered with an oxide film. Therefore, silicidation for reducing the parasitic resistances of the gate electrode and source and drain regions is not practicable.

Controlling a short channel effect is another important consideration in the semiconductor devices art. To reduce the short channel effect, it is a common practice to form a gate electrode containing an impurity. A source region, a drain region and a pocket structure adjoin the gate electrode. The pocket structure, however, increases the junction capacitance of the drain region. This, coupled with the miniaturization of semiconductor devices, aggravates the influence of the parasitic capacitances on the device characteristic. To prevent the junction capacitance of the drain region from increasing, ions may be implanted between a gate electrode and silicide source and drain regions, as taught in "IEEE TRANSACTION ON ELECTRON DEVICES", VOL. 42, NO. 1, JANUARY 1995, pp. 78–86. This kind of method, however, has another problem that because silicide is susceptible to heat, the impurity implanted after a silicide process cannot be sufficiently treated by heat.

Assume that a semiconductor device is subjected to heat treatment for causing an impurity to be evenly distributed in a gate electrode, and for activating the impurity in a source and a drain region. Then, if the heat treatment is short, the impurity in the gate electrode cannot be evenly distributed and prevents the resistance of the electrode from being lowered to a sufficient degree. Conversely, if the heat treatment is excessive, the impurity in the source and drain regions is scattered into a channel region, rendering the short channel effect conspicuous. In addition, the impurity in the gate electrode is scattered into the channel region via a gate insulation film, varying the threshold value.

SUMMARY OF THE INVENTION

It is therefore an object of the present invention to provide a reliable semiconductor device operable at high speed with a minimum of power consumption.

It is another object of the present invention to provide a method of producing a semiconductor device and capable of forming cavities in the side walls of a gate electrode by a procedure to which silicidation is applicable, and capable of forming a pocket structure by self-alignment.

It is another object of the present invention to provide a method of producing a semiconductor device and capable of reducing the fringe capacitance of a gate electrode, and activating an impurity contained in a source and a drain region without scattering it into a channel region excessively, while setting up a sufficiently even distribution of an impurity in the gate electrode.

It is another object of the present invention to provide a method of producing a semiconductor device and capable of reducing the fringe capacitance of a gate electrode while reducing the scattering of an impurity from the gate electrode into a channel region via a gate insulation film.

It is another object of the present invention to provide a method of producing a semiconductor device and capable of reducing the fringe capacitance of a gate electrode while preventing the number of exposing steps for an LDD (Lightly Doped Drain) structure from increasing.

It is another object of the present invention to provide a method of producing a semiconductor device and capable of reducing a fringe capacitance of a gate electrode while preventing the number of exposing steps for a local cannel region from increasing.

A semiconductor device of the present invention has a source region for supplying a carrier, a drain region for drawing out the carrier, a gate electrode for controlling, in response to a voltage applied thereto, the flow of the carrier from the source region to the drain region, and a semiconductor substrate forming in a device field the gate electrode, source region and drain region adjoining each other. Side walls are formed on the sides of the gate electrode. Cavities are formed between the side walls and the gate electrode for reducing a fringe capacitance between the gate electrode and the source and drain regions. Silicide is formed on the surfaces of the gate electrode and the surfaces of the source and drain regions from which an insulation film has been removed. The side walls are smaller in height than the gate electrode, so that the gate electrode protrudes upward over the side walls.

A method of producing a semiconductor device of the present invention includes a step of forming a gate electrode in a device field of a semiconductor substrate with the intermediary of a gate insulation film. Inner side walls and outer side walls are sequentially formed on the sides of the gate electrode. An impurity is implanted in the entire surface of the semiconductor substrate by ion implantation to thereby form a source region and a drain region while reducing the resistance of the gate electrode. The inner side walls are selectively removed to thereby form cavities between the outer side walls and the gate electrode for reducing a capacitance, and making the height of the outer side walls smaller than the height of the gate electrode. An insulation film is formed on the entire surface of the semiconductor substrate by CVD (Chemical Vapor Deposition) having a low covering characteristic, and then etched back to thereby expose the surface of the gate electrode and the surfaces of the source and drain regions. Finally, silicide is formed on the gate electrode and semiconductor substrate.

BRIEF DESCRIPTION OF THE DRAWINGS

The above and other objects, features and advantages of the present invention will become apparent from the following detailed description taken with the accompanying drawings in which:

FIGS. 2A–2G are sections showing a second embodiment of the present invention;

FIGS. 4A–4G are sections showing a fourth embodiment of the present invention;

FIGS. 5A–5H are sections showing a fifth embodiment of the present invention;

FIGS. 6A–6G are sections showing a sixth embodiment of the present invention;

FIG. 9 is a section showing a cavity formed in a side wall surrounding a gate electrode achievable with the present invention and observed through an electron microscope (SEM);

FIG. 10B shows a relation between a delay time and the contribution ratio of the individual parasitic capacitance.

DESCRIPTION OF THE PREFERRED EMBODIMENTS

Figure 11A:
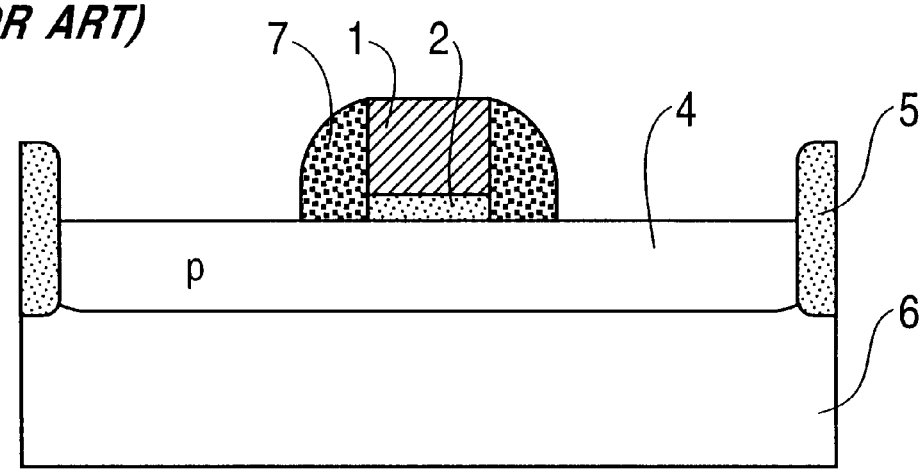
FIGS. 11A and 11B are sections demonstrating a conventional method of producing a semiconductor device.

To better understand the present invention, brief reference will be made to a conventional semiconductor device, shown in FIG. 11A. As shown, the semiconductor device has a p-type region or well 4 formed on a silicon substrate 6 and separated from the other devices by field insulation films 5. A gate electrode 1 is formed on the p-type well 4 with the intermediary of a gate insulation film 2. A third insulation film 7 is formed on the side walls of the gate electrode 1 and implemented as a silicon oxide film. This brings about a problem that a fringe capacitance exists between the gate electrode 1 and a source and a drain region via the silicone oxide film 7, slowing down the circuit operation of the device.

To reduce the fringe capacitance of a semiconductor device, use may be made of an organic insulation film or similar material having a lower dielectric constant than a silicone oxide film, as stated earlier. However, an organic insulation film low in heat resistance and dielectric constant is not applicable to the side walls of a gate due, considering heat treatment. Alternatively, cavities may be formed in the side walls of the gate electrode, as taught in Japanese Patent Laid-Open Publication No. 1-286363 or No. 7-193233 mentioned earlier. With the cavity scheme, however, it is impossible to expose the upper portions of the gate electrode, source region and drain region to the outside while keeping the top of the bore covered with the oxide film. Therefore, silicidation for reducing the parasitic resistances of the gate electrode and source and drain regions is not practicable.

Figure 11B:
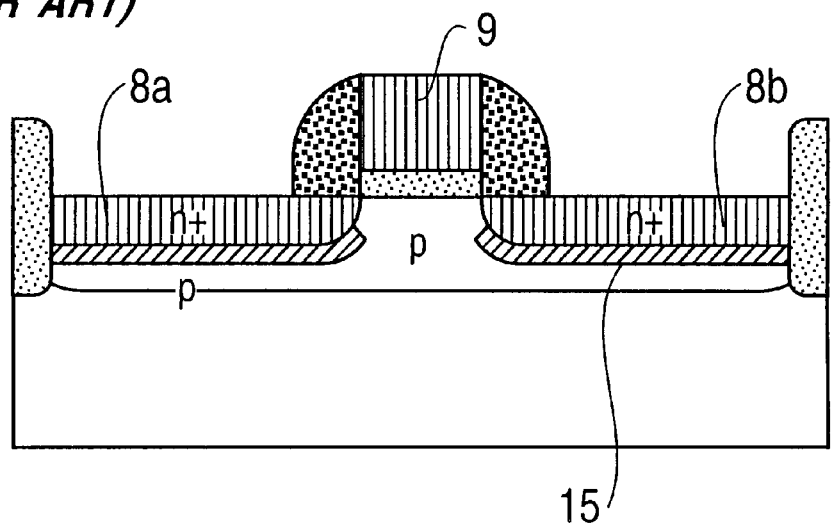

FIG. 11B shows another conventional semiconductor device configured to reduce the short channel effect. As shown, the device includes a gate electrode 9 containing an impurity. A source region 8a, a drain region 8b and a pocket structure 15 adjoin the gate electrode 9. The pocket structure 15, however, increases the junction capacitance of the drain region 8b. This, coupled with the miniaturization of semiconductor devices, aggravates the influence of the parasitic capacitances on the device characteristic. A pocket structure for preventing the junction capacitance of the drain region from increasing is disclosed in "IEEE TRANSACTION ON ELECTRON DEVICES" mentioned earlier. This kind of technology has some issues yet to be solved.

The device shown in FIG. 11B is subjected to heat treatment for causing the impurity to be evenly distributed in the gate electrode 9, and for activating the impurity in the source and drain regions 8a and 8b. However, if the heat treatment is short, the impurity in the gate electrode 9 cannot be evenly distributed and prevents the resistance of the electrode 9 from being lowered to a sufficient degree. Conversely, if the heat treatment is excessive, the impurity in the source and drain regions 8a and 8b is scattered into a channel region, rendering the short channel effect conspicuous. In addition, the impurity in the gate electrode 9 is scattered into the channel region via the gate insulation film 2, varying the threshold value.

Referring to FIGS. 1A–8G, a first to a seventh embodiment of the present invention will be described. As shown, the illustrative embodiments each includes a source region 8a or 14a, a drain region 8b or 14b, a gate electrode 9, side walls 10, and silicide 13. The source region 8a or 14a supplies a carrier while the drain region 8b or 14b draws out the carrier from the source region 8a or 14a. The gate electrode 9 controls, in response to a voltage applied thereto, the flow of the carrier from the source region 8a or 14a to the drain region 8b or 14b. The gate electrode 9 and the source region 8a or 14a and drain region 8b or 14b adjoin each other in the device field of a semiconductor substrate 6. The device field is delimited by field insulation films 5. The source region 8a or 14a and drain region 8b or 14b located at both sides of the drain electrode 9 may be replaced with each other in the right-and-left direction, as viewed in the drawings.

As shown in FIGS. 1G, 2G, 4G, 5G, 6G, 7G, 8G or 9, the side walls 10 are formed on the sides of the gate electrode 9. Cavities C intervene between the side walls 10 and the gate electrode 9 in order to reduce a fringe capacitance (see FIG. 10A) between the electrode 9 and the source region 8a or 14a and drain region 8b or 14b. To form the cavities C, inner and outer side walls 3 and 7, respectively, are formed in a laminate structure, and then the inner side walls 3 are selectively removed. As a result, the outer side walls 7 turn out the side walls 10 having the cavities C at the inside thereof.

As shown in FIGS. 1G, 2G, 3H, 4G, 5H, 6G, 7G, 8G or 9, the outer side walls 7 constituting the side walls 10 are smaller in height than the gate electrode 9, so that the electrode 9 protrudes upward over the top of the side walls 10. Insulation films 11 and 12 are formed on the entire surface of the substrate 6 by CVD (Chemical Vapor Deposition) having a poor covering characteristic. Subsequently, the films 11 and 12 are etched back in order to expose the surfaces of the gate electrode 9, source electrode 8a or 14a, and drain electrode 8b or 14b. Thereafter, the silicide 13 is formed on the gate electrode 9 and substrate 6.

As shown in FIG. 9, the cavities C intervening between the gate electrode 9 and the source region 8a and drain region 8b replace the conventional insulation film. Because the cavities C have the same dielectric constant as air, the fringe capacitance (FIG. 10A) generated between the gate electrode 9 and the source region 8a and drain region 8b via the side walls 10 can be reduced to a noticeable degree.

The configuration described above with reference to 1G. 2G, 3H, 4G, 5H, 6G, 7G, 8G and 9 allows the gate electrode 9, source electrode 8a or 14a and drain electrode 8b or 14b to be wired via the silicide 13. This successfully reduces the resistance of the device.

Figure 3A:
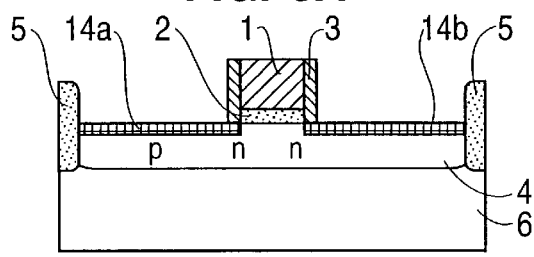
FIGS. 3A–3H are sections showing a third embodiment of the present invention.
Figure 3E:
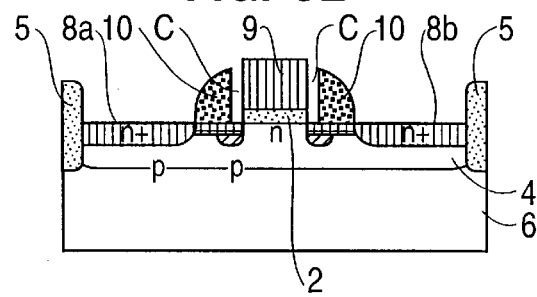
Figure 3B:
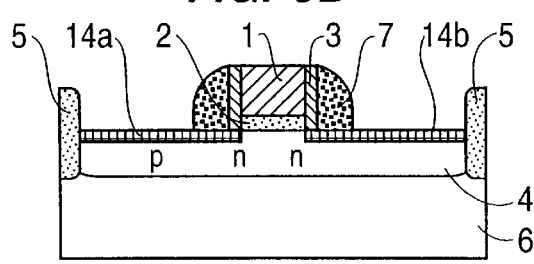
Figure 3F:
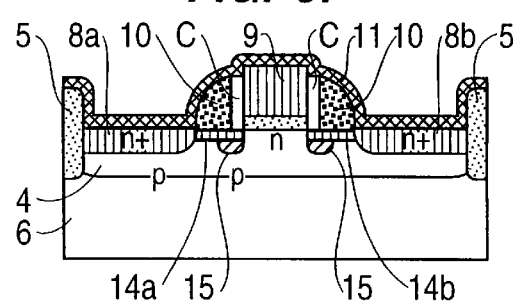
Figure 3C:
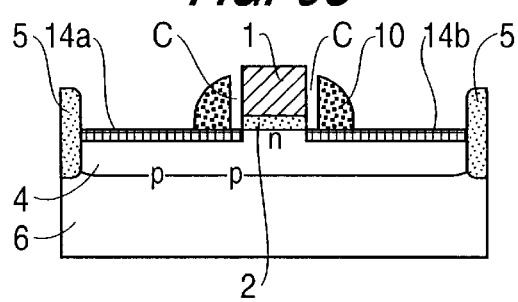
Figure 3G:
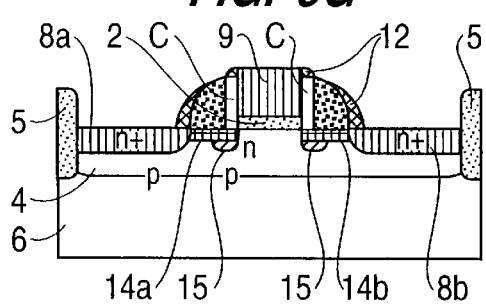
Figure 10A:
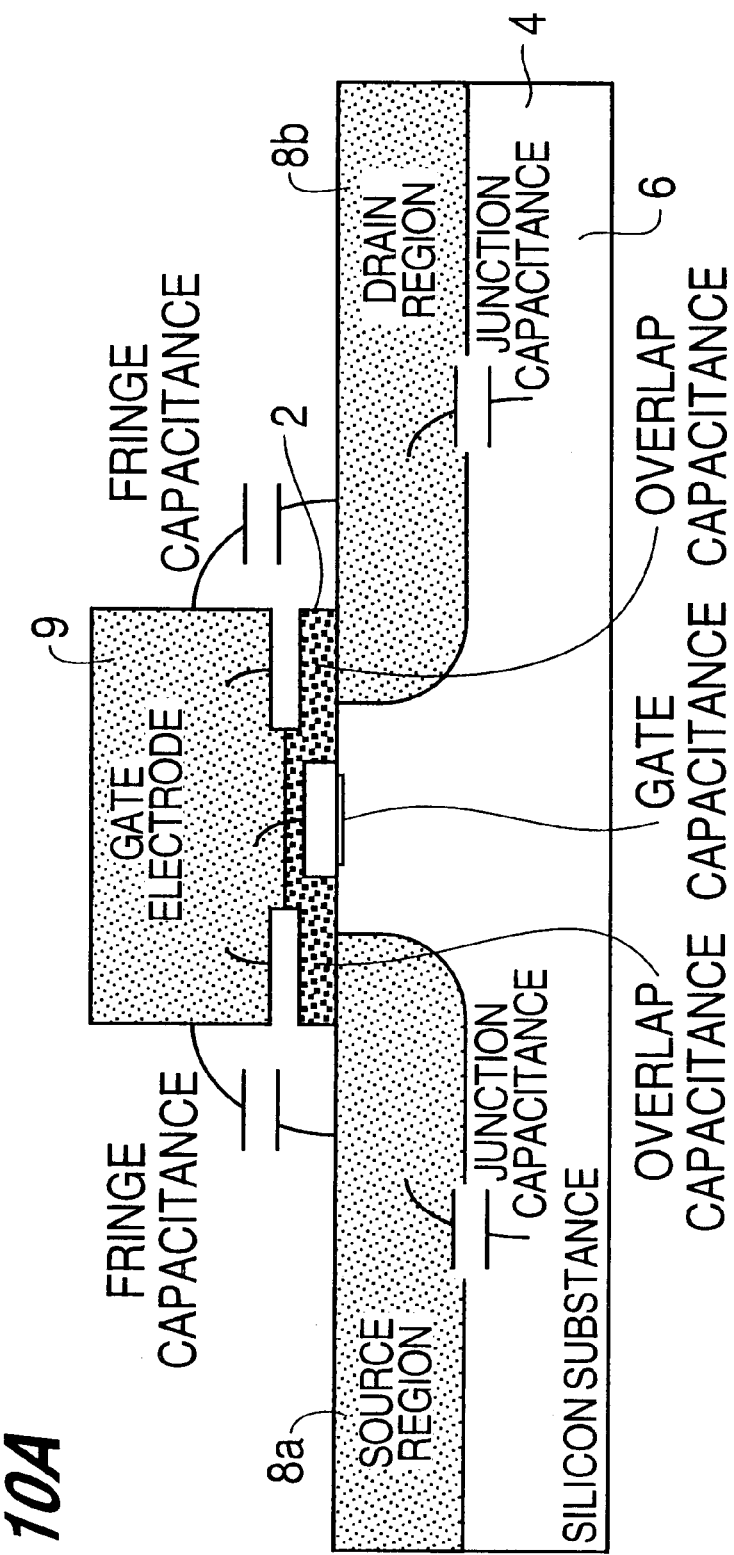
FIG. 10A shows various parasitic capacitances particular to an FET.

The configurations shown in FIGS. 2G, 3G and 4G each includes a pocket structure 15 in order to reduce the short channel effect. The pocket structure is confined in the regions below the cavities intervening between the gate electrode 9 and the side walls 10. Therefore, the short channel effect can be reduced without increasing the junction capacitance in the portions where the gate electrode 9 and the source region 8a and drain region 8b overlap each other, as shown in FIGS. 10A and 10B.

Figure 7A:
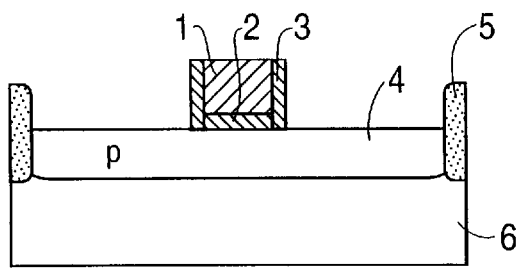
FIGS. 7A–7G and 8A–8G are sections showing a seventh embodiment of the present invention.
Figure 7E:
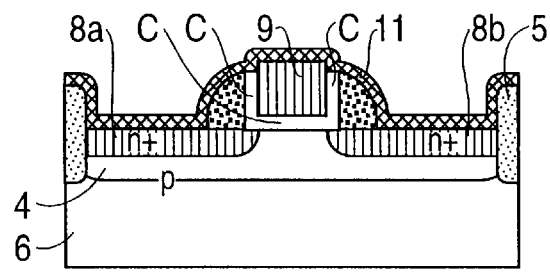
Figure 7B:
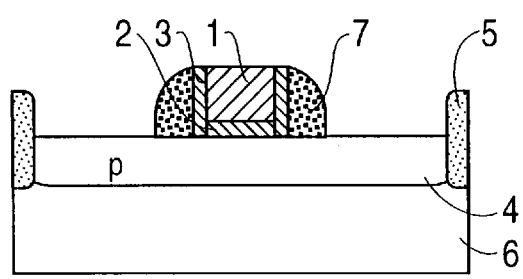
Figure 7F:
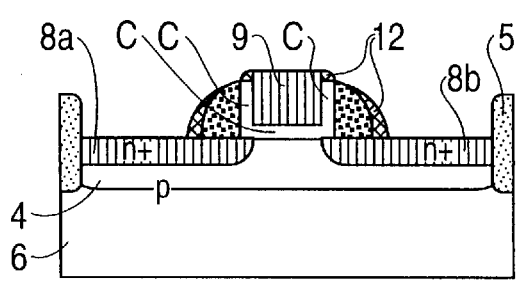
Figure 7C:
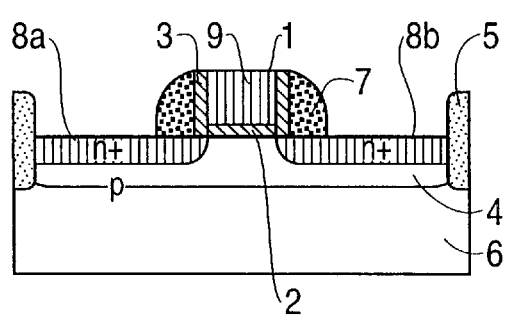
Figure 7G:
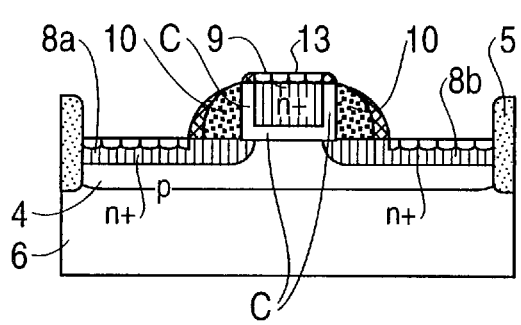
Figure 8A:
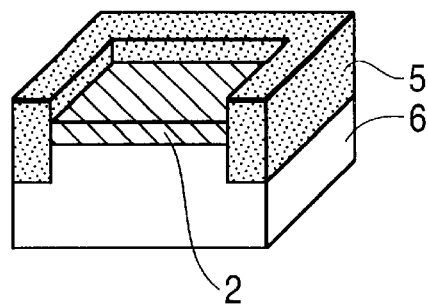
Figure 8B:
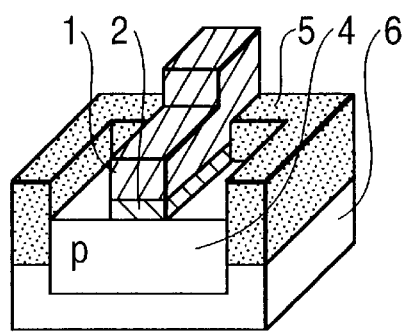
Figure 8C:
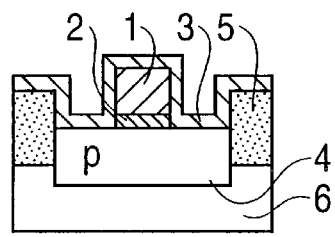
Figure 8D:
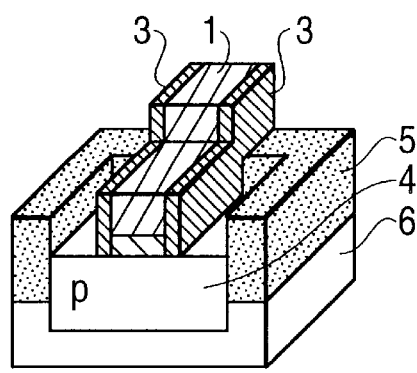
Figure 8E:
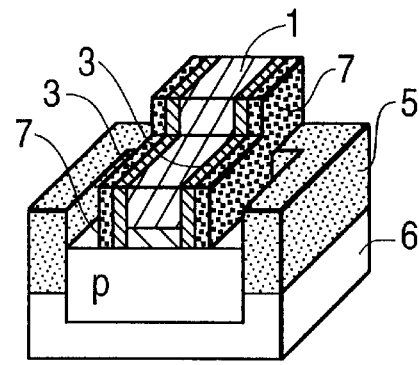
Figure 8F:
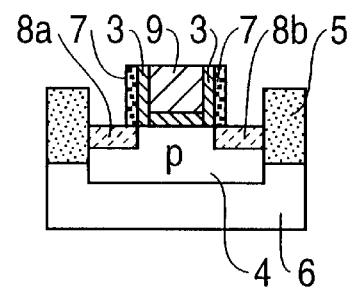
Figure 8G:
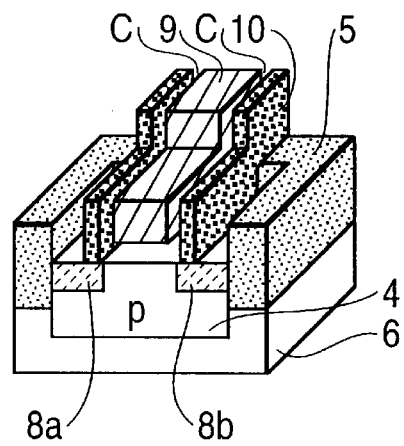

In the structures shown in FIGS. 7G and 8G, the gate electrode 9 has its opposite ends supported by the field insulation films 5 delimiting the device field, so that the electrode 9 is raised above the substrate 6. As a result, the cavities C are formed between the gate electrode 9 and the side walls 10. At the same time, the cavities C are formed between the gate electrode 9 and the source region 8a and drain region 8b in place of the gate insulation film 2. In this configuration, the gate electrode 9 and the source region 8a and drain region adjoin each other with the intermediary of the cavities C. This reduces not only the fringe capacitance shown in FIG. 10A, but also the overlap capacitance and gate capacitance. Again, the side walls 10 are smaller in height than the gate electrode 9, so that the electrode 9 protrudes upward over the top of the side walls 10. The insulation films 11 and 12 are etched back in order to expose the surfaces of the gate electrode 9, source electrode 8a or 14a, and drain electrode 8b or 14b. Thereafter, the silicide 13 is formed on the gate electrode 9 and substrate 6. This allows the gate electrode 9, source electrode 8a or 14a and drain electrode 8b or 14b to be wired via the silicide 13, thereby reducing the resistance of the device.

The illustrative embodiments will be described more specifically hereinafter.

As shown in FIGS. 1A–1G, a first embodiment of the present invention includes at least a step of forming a gate electrode, a step of forming side walls, a step of forming a source and a drain region, a step of forming cavities, and a step of forming silicide, as follows.

Figure 1A:
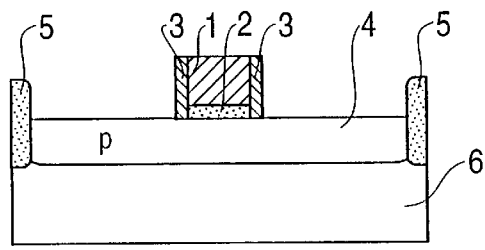
FIGS. 1A–1G are sections showing a first embodiment of a method of producing a semiconductor device in accordance with the present invention.

First, as shown in FIG. 1A, a device field 4 is delimited by the field insulation films 5 on the semiconductor substrate 6 formed of silicon. A 4 nm thick thermal silicon film serving as the gate insulation film 2 is formed on the entire surface of the device field 4. Then, an impurity is implanted in the substrate 6 by ion implantation in order to form the p-type well (device field) 4. After a 150 nm thick polysilicon film has been formed on the silicon film 2, the two silicon films are patterned such that the gate electrode 1 having a gate length of 0.15 nm and gate insulation film 2 underlying the electrode 1 remain. As a result, the gate electrode 1 is formed in the device field (p-type well) 4 via the gate insulation film 2.

Figure 1E:
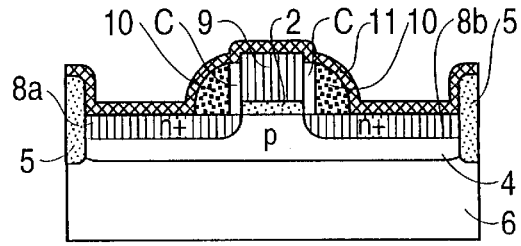
Figure 1B:
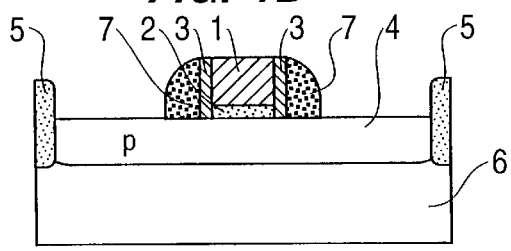

As shown in FIGS. 1A and 1B, the inner or first side walls 3 are formed on the sides of the gate electrode 1 formed by the above procedure. The side walls 3 are implemented as 20 nm thick silicon nitride films. Then, the outer or second side walls 7 are formed on the inner side walls 3 and implemented as 50 nm thick silicon oxide films.

Figure 1F:
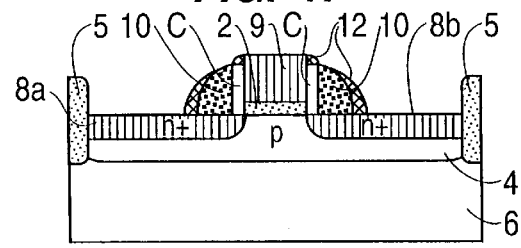
Figure 1C:
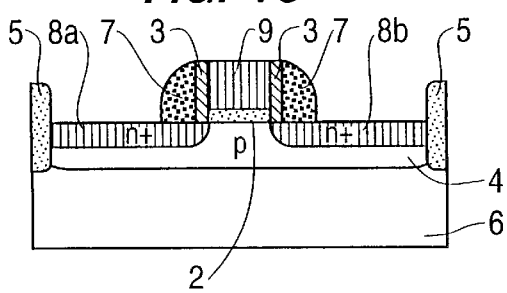

As shown in FIG. 1C, an impurity implemented as boron is implanted in the entire surface of the substrate 6 under the conditions of 40 KeV and 2E12 $cm^{-2}$. This forms the source region 8a and drain region 8b while reducing the resistance of the gate electrode 1. The gate electrode 1 turns out the gate electrode 9 containing the impurity. The gate electrode 9 has a lower resistance than the original gate electrode 1 not containing the impurity.

Figure 1G:
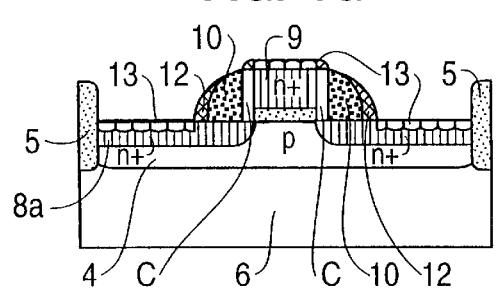
Figure 1D:
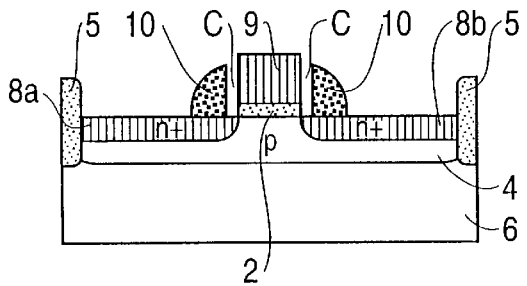

As shown in FIG. 1D, the inner side walls or silicon nitride films 3 are selectively removed by hot phosphoric acid so as to form the cavities C between the outer side walls 7 and the gate electrode 9. The cavities C have heretofore been occupied by the side walls or silicon nitride films 3. Because the silicon nitride films have a greater dielectric constant than air, the fringe capacitance, FIG. 10A, ascribable to the side walls 3 and 7 increases. By contrast, in the illustrative embodiment, the side walls 3 are replaced with the cavities or air layers C, the fringe capacitance is successfully reduced. The upper portions of the outer side walls 7 are removed by hydrofluoric acid, to create side walls 10 lower than the gate electrode 9.

As shown in FIGS. 1E–1G, the silicon oxide film or insulation film 11 is formed on the entire surface of the substrate 6 to a thickness of 50 nm by normal pressure CVD, closing the top openings of the cavities C. Because the normal pressure CVD has an inherently low covering characteristic, the silicon oxide film 11 does not penetrate into the cavities C, but stop at the open ends of the cavities C. This guarantees the cavities C between the gate electrode C and the side walls 10.

After the above procedure, the steps shown in FIGS. 1F and 1G are executed in order to form a semiconductor device. As shown in FIG. 1F, the silicon oxide film 11 is etched back by dry etching such that the silicon oxide film or insulation film 12 remains only on the side walls 10 and the top edges of the cavities C. As a result, the top of the gate electrode 9 and the surfaces of the source region 8a and drain region 8b are exposed to the outside. Subsequently, as shown in FIG. 1G, the silicide 13 is formed on the gate electrode 9, source region 8a, and drain region 8b.

Finally, after an insulation film has been formed on the silicide 13, through holes are formed in the insulation film. The gate electrode 9, source region 8a and drain region 8b are each formed with a contact portion. Consequently, a semiconductor device is completed on the substrate 6.

While the first embodiment has concentrated on an n-type FET, it is similarly applicable to a p-type FET.

As stated above, in the illustrative embodiment, the cavities C replace the conventional insulation film, and therefore reduces the fringe capacitance, as shown in FIG. 10A. When the device is miniaturized, the influence of the various capacitances shown in FIG. 10A, i.e., parasitic capacitances on the device characteristic becomes extremely great. Because the fringe capacitance of the gate electrode is related to the distance between the gate electrode and the source and drain regions as well as to the dielectric constant of the dielectric intervening between them. It follows that even when the device is miniaturized, the distance between the gate electrode and the source and drain regions cannot be reduced beyond a certain limit, fixing the fringe capacitance without regard to the miniaturization. By contrast, with the illustrative embodiment, it is possible to reduce the fringe capacitance, and therefore to obviate the influence of the fringe capacitance despite the miniaturization. Further, the embodiment reduces the resistance of the device due to the configuration shown in FIGS. 1E–1G.

Referring to FIGS. 2A–2G, a second embodiment of the present invention includes at least a step of forming a gate electrode, a step of forming a first source region and a first drain region, a step of forming cavities, a step of forming a pocket structure, and a step of forming a second source region and a second drain region.

Specifically, as shown in FIG. 2A, the gate electrode 1 is formed in the device field 4 of the substrate 6 with the intermediary of the gate insulation film 2. This step is identical with the step shown in FIG. 1A.

As shown in FIGS. 2A and 2B, the inner or first side walls 3 are formed on the sides of the gate electrode 1. An impurity is implanted in the entire surface of the substrate 6 in order to form a first source region 14a and a first drain region 14b. These regions 14a and 14b each has a shallow impurity distribution and an LDD structure.

As shown in FIG. 2C, the second or outer side walls 7 are formed on the inner side walls 3. Then, the inner side walls 3 are selectively removed by hot phosphoric acid in order to form the cavities C between the outer side walls 7 and the gate electrode 1. This step is substantially identical with the step shown in FIG. 1D. As shown in FIG. 2D, the upper portions of the outer side walls 7 are removed by hydrofluoric acid. As a result, the outer side walls 7 turn out the side walls 10 smaller in height than the gate electrode 9.

As shown in FIG. 2D, phosphor or similar impurity different in polarity from the impurity contained in the first source and drain regions 14a and 14b is implanted in the cavities C and the areas outside of the side walls 10 under the conditions of 60 KeV and 1E13 cm$^{-2}$. As a result, the pocket structure 15 is formed only beneath the portions of the first source and drain regions 14a and 14b underlying the cavities C and the outside of the side walls 10.

As shown in FIGS. 2E and 2F, after the top openings of the cavities C have been closed, an impurity is implanted in the entire surface of the substrate 6. The impurity increases the thickness of the source and drain regions 14a and 14b only at the outside of the side walls 10. As a result, a second source region 8a and a second drain region 8b having a deep impurity distribution are formed. At the same time, the resistance of the gate electrode 9 is reduced. To close the top openings of the cavities C, the step described with respect to FIG. 1E is executed.

The formation of the second source and drain regions 8a and 8b is followed by the formation of the silicide 13, shown in FIGS. 2E–2G, and that of contact portions. By the foregoing procedure, a semiconductor device is completed, as shown in FIG. 2G.

As shown in FIG. 2G, the pocket structure 15 is positioned only beneath the cavities C of the side walls 10 surrounding the gate electrode 9. The source and drain regions 14a and 14b having a shallow impurity distribution and connecting the source and drain regions 8a and 8b and pocket structure 15 are positioned beneath the side walls 10 and are thin. Therefore, as shown in FIG. 10B, the short channel effect can be reduced without increasing the junction capacitance as shown in FIG. 10A. This embodiment, like the first embodiment, reduces the resistance of the device because it allows the gate electrode 9 and source and drain regions 8a and 8b to be wired via the silicide 13 due to the unique configuration.

Figure 3D:
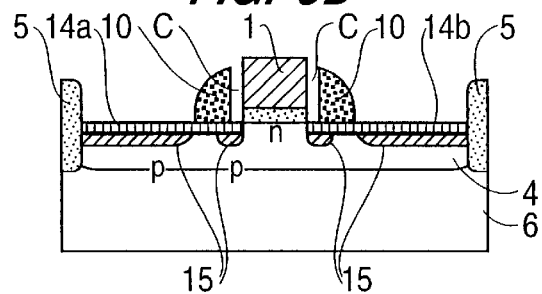
Figure 3H:
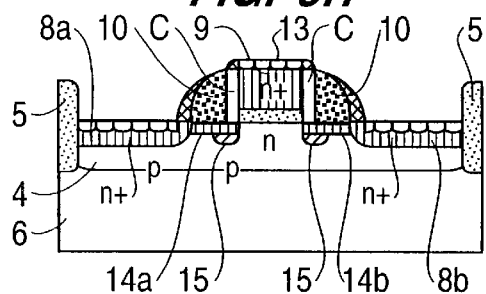

Referring to FIGS. 3A–3H, a third embodiment of the present invention is shown which is similar to the second embodiment except for the following. As shown in FIG. 3E, to form the second source and drain regions, the impurity is implanted in the side walls 10 in the oblique direction, i.e., at an angle of 8 degrees in the illustrative embodiment. As shown in FIG. 3D, the upper portions of the outer side walls 7 are removed by hydrofluoric acid, so that the side walls 10 are lower than the gate electrode 9. This is followed by the formation of the silicide 13 shown in FIGS. 2E–2G and that of contact portions. FIG. 3H shows the resulting semiconductor device.

When the third embodiment is applied to a CMOS (Complementary Metal Oxide Semiconductor) process, it reduces the number of exposing steps for the formation of the pocket structure due to the oblique ion implantation, compared to the second embodiment. Again, the resistance of the device is reduced because the gate electrode 9 and source and drain regions 8a and 8b are allowed to be wired via the silicide 13.

FIGS. 4A–4G show a fourth embodiment of the present invention similar to the third embodiment except for the following. In this embodiment, the step of forming the first source and drain regions shown in FIGS. 4A and 4B and the step of forming the pocket structure shown in FIG. 4D are effected after the formation of the cavities shown in FIG. 4B. As shown in FIG. 4D, the ion implantation for forming the second source and drain regions is effected obliquely with respect to the side walls 10, as in FIG. 3E of the third embodiment. As shown in FIG. 4B, the upper portions of the side walls are removed by hydrofluoric acid in order to make the side walls 10 lower than the gate electrode 9. FIGS. 4E–4G show the formation of the silicide and that of contact portions.

Specifically, as shown in FIG. 4C, an impurity is implanted vertically into the silicon substrate 6 in order to form the first source and drain regions (LDD structure) 14a and 14b and pocket structure 15. The regions 14a and 14b and pocket structure 15 are positioned beneath the cavities C. Subsequently, as shown in FIG. 4D, an impurity is implanted obliquely, i.e., at an angle of 8 degrees for forming the second source and drain regions 8a and 8b and lowering the resistance of the gate electrode 9. This prevents the impurity from being distributed beneath the cavities.

As stated above, using the side walls 10, this embodiment forms the source and drain regions 14a and 14b having a shallow junction by implanting the impurity perpendicularly to the substrate 6, and then forms the source and drain regions 8a and 8b having a deep junction and gate electrode 9 by implanting the impurity in the oblique direction. This kind of procedure eliminates the need for exposure for the formation of the LDD regions. Again, the resistance of the device is reduced because the gate electrode 9 and source and drain regions 8a and 8b are allowed to be wired via the silicide 13.

Referring to FIGS. 5A–5H, a fifth embodiment of the present invention will be described. The fifth embodiment includes at least a step of forming a gate electrode, a step of forming side walls, a step of forming first source and drain regions, a step of forming cavities, a heat treating step, a step of forming second source and drain regions, and an activating step.

As shown in FIG. 5A, the gate electrode 1 is formed in the device region 4 of the substrate 6 with the intermediary of the gate insulation film 2, as in the step shown in FIG. 1A. Then, as shown in FIG. 5B, the inner side walls 3 and outer side walls 7 are sequentially formed on the sides of the gate electrode 1, as in the step shown in FIG. 1B.

As shown in FIG. 5C, an impurity is implanted in the entire surface of the substrate 6 in order to form the source and drain regions 8a and 8b having a deep impurity distribution, and to lower the resistance of the gate electrode 1 for thereby forming the gate electrode 9 containing the impurity. The implantation is effected such that the ions forming the two regions 8a and 8b are not distributed in the channel region.

As shown in FIG. 5D, the inner side walls 3 are selectively removed in order to form the cavities C between the gate electrode 9 and the outer side walls 7 for reducing the capacitance, as in the step shown in FIG. 1D. The upper portions of the outer side walls 7 are removed by hydrofluoric acid, to create the side walls 10 lower than the gate electrode 9. Subsequently, heat treatment is executed in order to activate the impurity layer constituting the source and drain regions 8a and 8b, and to set up a uniform distribution of the impurity in the gate electrode 9.

As shown in FIG. 5E, an impurity is implanted in the entire surface of the substrate 6 in order to connect the channel region and the source and drain regions 8a and 8b having a deep impurity distribution. Also, the implantation forms the source and drain regions 14a and 14b having a shallow impurity distribution on the above regions 8a and 8b.

As shown in FIG. 5E, the impurity in the source and drain regions 14a and 14b is activated. Thereafter, as shown in FIGS. 5F–5H, the silicide 13 and contact portions are formed in the same manner as in the first embodiment.

In this embodiment, the semiconductor device is assumed to be of n-type. The impurity contained in the gate electrode 9 is arsenic or similar element having a great mass. Therefore, sufficient heat treatment is necessary for such an impurity to be evenly distributed in the gate electrode 9. However, sufficient heat treatment causes the impurity layer forming the source and drain regions of the substrate 6 to be scattered into the channel region, deteriorating the characteristic of the transistor. In the illustrative embodiment, the source and drain regions 14a and 14b with a shallow impurity distribution are formed after the formation of the source and drain regions 8a and 8b with a deep impurity distribution and the distribution of the impurity in the gate electrode 9. This allows the impurity to be sufficiently evenly distributed in the gate electrode 9, and obviates the scattering of the impurity from the electrode 9 into the substrate 6 and the excessive horizontal scattering of the impurity from the regions 14a and 14b ascribable to heat treatment. In addition, the resistance of the device is reduced because the gate electrode 9 and source and drain regions 8a and 8b are allowed to be wired via the silicide 13.

FIGS. 6A–6G show a sixth embodiment of the present invention different from the first to fourth embodiments, as follows. In this embodiment, after the cavities C have been formed by a step shown in FIG. 6C, the well 4 defining the device field 4 is formed by a step shown in FIG. 6D. Specifically, to form the well 4, an impurity is implanted in the substrate 6 with the gate electrode 1 and side walls 10 located at the inside and outside of the cavities C, respectively, serving as a mask. The other steps of this embodiment are identical with the steps of the first to fourth embodiments.

With this embodiment, it is possible to limit the impurity distribution in the channel region without increasing the number of exposing steps. Further, ion implantation for forming the channel region is effected after ion implantation for forming the source and drain regions 14a and 14b having a shallow impurity distribution, i.e., the LDD structure. Therefore, it is possible to reduce the redistribution of the impurity in the channel region ascribable to the ion implantation for implementing the LDD structure. In addition, the resistance of the device is reduced because the gate electrode 9 and source and drain regions 8a and 8b are allowed to be wired via the silicide 13.

Reference will be made to FIGS. 7A–7G and 8A–8G for describing a seventh embodiment of the present invention. This embodiment removes the gate insulation film 2 and inner side walls 3 at the same time while maintaining the gate electrode 9 supported by the field insulation films 5 at both ends thereof.

Specifically, as shown in FIGS. 7A and 8A, in the case where the field insulation films 5 delimiting the device field 4 are formed by LOCOS (Local Oxidation of Silicon), the silicon nitride film on the device field 4 is entirely removed. By contrast, as shown in FIGS. 7A and 8B, the illustrative embodiment leaves the silicon nitride film by a thickness of 10 nm and uses it as the gate insulation film 2. The gate electrode 1 is formed on the gate insulation film 2 with both ends thereof supported by the field insulation films 5. Subsequently, the film 2 and electrode 1 are patterned.

Thereafter, as shown in FIGS. 7A, 7B, 8C and 8D, the inner side walls 3 in the form of silicon nitride films are formed on the sides of the gate electrode 1. Then, the outer side walls 7 are formed on the side walls 3. Also, as shown in FIGS. 7C and 8F, an impurity is implanted in the substrate 6 in order to form the source and drain regions 8a and 8b.

Figure 7D:
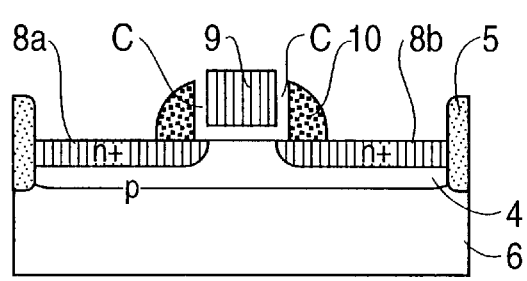

As shown in FIGS. 7D and 8G, the gate insulation film or silicon nitride film 2 and side walls 3 are removed by hot phosphoric acid. As a result, the gate electrode 9 is raised above the substrate 6 while being supported by the field insulation films 5 at both ends thereof. At the same time, the cavities C are formed between the gate electrode 9 and the outer side walls 7. The cavities C are also formed between the gate electrode 9 and the source and drain regions 8a and 8b in place of the gate insulation film 2.

In the above configuration, the gate electrode 9 and source and drain regions 8a and 8b adjoin each other with the intermediary of the cavities C. This reduces not only the fringe capacitance but also the overlap capacitance and gate capacitance. Further, such a configuration is free from the scattering of the impurity from the gate electrode 9 into the substrate 6 and the deterioration of the carrier. In addition, the resistance of the device is reduced because the gate electrode 9 and source and drain regions 8a and 8b are allowed to be wired via the silicide 13.

In summary, it will be seen that the present invention provides a semiconductor device and a method of producing the same having various unprecedented advantages, as enumerated below.

(1) Cavities intervene between a gate electrode and a source and a drain region for reducing a capacitance. The cavities successfully reduces a fringe capacitance between the gate electrode and the source and drain regions. Side walls are smaller in height than the gate electrode, so that the electrode protrudes upward over the top of the side walls. Insulation films are etched back in order to expose the surfaces of the gate electrode and source and drain electrodes. Thereafter, silicide is formed on the gate electrode and a substrate. This allows the gate electrode and source and drain electrodes to be wired via the silicide and thereby reduces the resistance of the device.

(2) A pocket structure is formed only beneath the cavities intervening between the gate electrode and the side walls. Therefore, a short channel effect can be reduced without increasing the junction capacitance in the portions where the gate electrode and the source and drain regions overlap each other.

(3) The gate electrode has its opposite ends supported by field insulation films delimiting a device field on the substrate, so that the electrode is raised above the substrate. As a result, the cavities are formed between the gate electrode and the side walls. At the same time, the cavities is formed between the gate electrode and the source and drain regions in place of a gate insulation film. In this configuration, the gate electrode and source and drain regions adjoin each other with the intermediary of the cavities. This reduces not only the fringe capacitance but also the overlap capacitance and gate capacitance.

(4) The cavities reduce the fringe capacitance of the gate electrode. Because ion implantation is effected by using the cavities, a pocket structure is confined in the regions beneath the cavities. The short channel effect can therefore be reduced without increasing the junction capacitance.

(5) The side walls are used to form source and drain regions having a shallow junction by implanting an impurity perpendicularly to the substrate, and then form source and drain regions having a deep junction and a gate electrode by implanting an impurity in the oblique direction. This kind of procedure eliminates the need for exposure for the formation of the LDD regions.

(6) The LDD structure is formed after the formation of the source and drain regions with a deep junction and the distribution of the impurity in the gate electrode. This allows the impurity to be sufficiently evenly distributed in the gate electrode, and obviates the scattering of the impurity from the electrode into the substrate and the excessive horizontal scattering of the impurity from the source and drain regions ascribable to heat treatment.

(7) It is possible to limit the impurity distribution in the channel region without increasing the number of exposing steps because ion implantation uses the cavities of the side walls.

(8) While the cavities are formed in the side walls, the gate insulation film is removed. This reduces the thermal scattering of the impurity from the gate electrode into the substrate, and obviates hot carrier deterioration.

Various modifications will become possible for those skilled in the art after receiving the teachings of the present disclosure without departing from the scope thereof.

What is claimed is:

1. A semiconductor device comprising:
   a source region for supplying a carrier;
   a drain region for drawing out the carrier;
   a gate electrode for controlling, in response to a voltage applied thereto, a flow of the carrier from said source region to said drain region;
   a semiconductor substrate forming said gate electrode, said source region and said drain region adjoining each other;
   side walls formed on sides of said gate electrode;
   cavities formed directly between said side walls and said gate electrode for reducing a fringe capacitance between said gate electrode and said source and drain regions; and
   silicide formed on said gate electrode and on said source and drain regions;
   wherein said side walls are smaller in height than said gate electrode, so that said gate electrode protrudes upward over said side walls.

2. A device as claimed in claim 1, further comprising a pocket structure formed only in a region beneath said cavities, for suppressing a short channel effect.

3. A device as claimed in claim 1, wherein the cavities are air gaps that provide a spatial separation between said side wall, and said gate electrode.

4. A semiconductor device comprising:
   a source region for supplying a carrier;
   a drain region for drawing out the carrier;
   a gate electrode for controlling, in response to a voltage applied thereto, a flow of the carrier from said source region to said drain region;
   a semiconductor substrate forming said gate electrode, said source region and said drain region adjoining each other;
   side walls formed on sides of said gate electrode; and
   cavities intervening directly between said gate electrode and said side walls and between said gate electrode and said source and drain regions, for reducing a fringe capacitance between said gate electrode and said source and drain electrodes, an overlap capacitance, and a gate capacitance;
   wherein said gate electrode is raised above a semiconductor substrate by having opposite ends thereof supported by field insulation films delimiting said device field.

5. A device as claimed in claim 4, further comprising silicide formed on said gate electrode and on said source and drain regions.

6. A device as claimed in claim 4, further comprising a pocket structure formed only in a region beneath said cavities, for suppressing a short channel effect.

* * * * *